United States Patent
Liu et al.

(10) Patent No.: US 6,204,553 B1
(45) Date of Patent: Mar. 20, 2001

(54) LEAD FRAME STRUCTURE

(75) Inventors: Wen-Chun Liu; Hui-Ping Liu; Jung-Jie Liou, all of Kaohsiung; Yi-Hsiang Pan, Kaohsiung Hsien; Sheng-Tung Tsai, Kaohsiung, all of (TW)

(73) Assignee: Walsin Advanced Electronics Ltd., Kaohsiung (TW)

( * ) Notice: Subject to any disclaimer, the term of this patent is extended or adjusted under 35 U.S.C. 154(b) by 0 days.

(21) Appl. No.: 09/371,677

(22) Filed: Aug. 10, 1999

(51) Int. Cl.[7] .................................................. H01L 23/495
(52) U.S. Cl. ........................................ 257/676; 257/669
(58) Field of Search .................................... 257/666, 669, 257/676

(56) References Cited

U.S. PATENT DOCUMENTS

| | | | | |
|---|---|---|---|---|
| 4,918,511 | * | 4/1990 | Brown | 257/676 |
| 5,278,446 | * | 1/1994 | Nagaraj et al. | 257/676 |
| 5,712,507 | * | 1/1998 | Eguchi et al. | 257/676 |

* cited by examiner

*Primary Examiner*—Roy Potter
(74) *Attorney, Agent, or Firm*—Jiawei Huang; J C Patents

(57) ABSTRACT

A lead frame for a semiconductor package. The lead frame includes a die pad and a plurality of leads. One surface of the die pad supports a silicon chip while the other surface has a plurality of annular grooves all having the same geometric center. The inner lead portion of the leads surrounds the die pad, but the die pad and the leads are on different planar surfaces.

11 Claims, 4 Drawing Sheets

LEAD FRAME STRUCTURE

BACKGROUND OF THE INVENTION

1. Field of Invention

The present invention relates to a lead frame structure. More particularly, the present invention relates to a lead frame structure having a cooling surface that can enhance the cooling capacity of a semiconductor package.

2. Description of Related Art

As semiconductor manufacturing continues to make progress, the level of integration of integrated circuit (IC) devices and hence computational speed will increase. When the devices in a silicon chip is in operation, a great amount of heat is generated. If the integrated circuit rises above a certain permissible range of temperature, some of the integrated circuit devices within the chip may produce errors. When the devices are seriously overheated, they may even be permanently damaged. Hence, how to lower the working temperature of (IC) devices becomes an important manufacturing consideration. A metallic lead frame inside a package is in direct contact with a silicon chip. Because metal is a good thermal conductor, most packages have a portion of the metallic lead frame exposed so that cooling rate can be increased.

FIG. 1 is a schematic, cross-sectional diagram showing a conventional semiconductor package with a lead frame inside. As shown in FIG. 1, the lead frame 16 inside the semiconductor package 10 includes a die pad 12 and a plurality of leads 14. Each lead 14 can be divided into an inner lead portion 18 and an outer lead portion 20. The die pad 12 is formed on a surface at a different height level from the inner lead portion 18. After molding, the inner lead portion 18 of the lead frame 16 is enclosed by packaging material 30 while the backside of the die pad 12 is exposed. The method of forming a semiconductor package involves the step of attaching a silicon chip 22 to a die pad 12. A wire-bonding operation is next carried out to connect from the bonding pads on the chip 22 to the leads 14 on the lead frame 16 using metallic wires 26. The silicon chip and the lead frame 16 are placed inside a set of mold such that the bottom surface of the die pad 12 is in direct contact with a bottom mold piece. Molding material 30 is injected into the mold so that only the outer lead portions 68 and the bottom surface 28 of the die pad are exposed. Finally, the leads are trimmed and formed to create a complete package.

When molding material 30 is injected into the mold, the mold and the die pad 12 may not form a perfect seal. Hence, some of the molding material 30 may leak through crevices between the mold and the bottom surface 28 of the die pad 12 and then spread over the entire bottom surface 28. Because the molding material 30 is a poor conductor of heat, cooling area will be greatly reduced and hence less heat will be carried away from the silicon chip 22. To return the cooling rate to the intended level, molding material on the die pad surface 28 has to be removed by polishing. However, this will increase the processing time and incur additional production cost.

SUMMARY OF THE INVENTION

The present invention provides a lead frame structure for a semiconductor package that can increase the cooling rate and preventing the formation of residual molding material on cooling surface, thereby improving the quality of the semiconductor package and lowering the production cost.

To achieve these and other advantages and in accordance with the purpose of the invention, as embodied and broadly described herein, the invention provides a lead frame structure for a semiconductor package. The lead frame has a die pad. One surface of the die pad supports a silicon chip while the other surface of the die pad is a cooling surface. The cooling surface of the die pad has a plurality of annular trenches. All of the annular trenches have identical geometric center. The die pad area is surrounded by a plurality of inner leads and outer leads. The leads are formed on a planar surface at a different height level from the die pad so that the bottom surface of the die pad will be exposed after packaging. Because die surface with annular trenches is in contact with the mold, any leakage of molding material is likely to be trapped inside one of the annular trenches instead of spreading over the entire pad surface. Furthermore, the additional annular trenches on the die pad increase the total cooling surface, and hence more heat will be carried away from the package.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
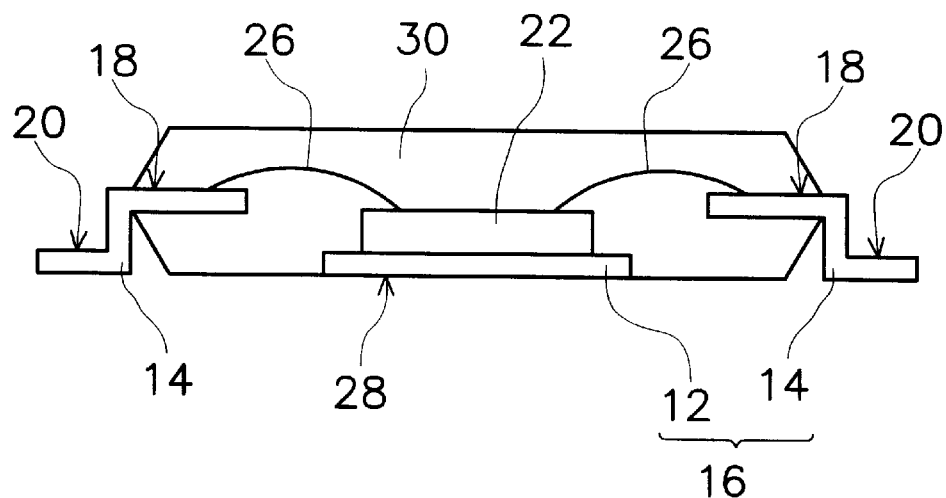
FIG. 1 is a schematic, cross-sectional diagram showing a conventional semiconductor package with a lead frame inside.

Reference will now be made in detail to the present preferred embodiments of the invention, examples of which are illustrated in the accompanying drawings. Wherever possible, the same reference numbers are used in the drawings and the description to refer to the same or like parts.

Figure 2:
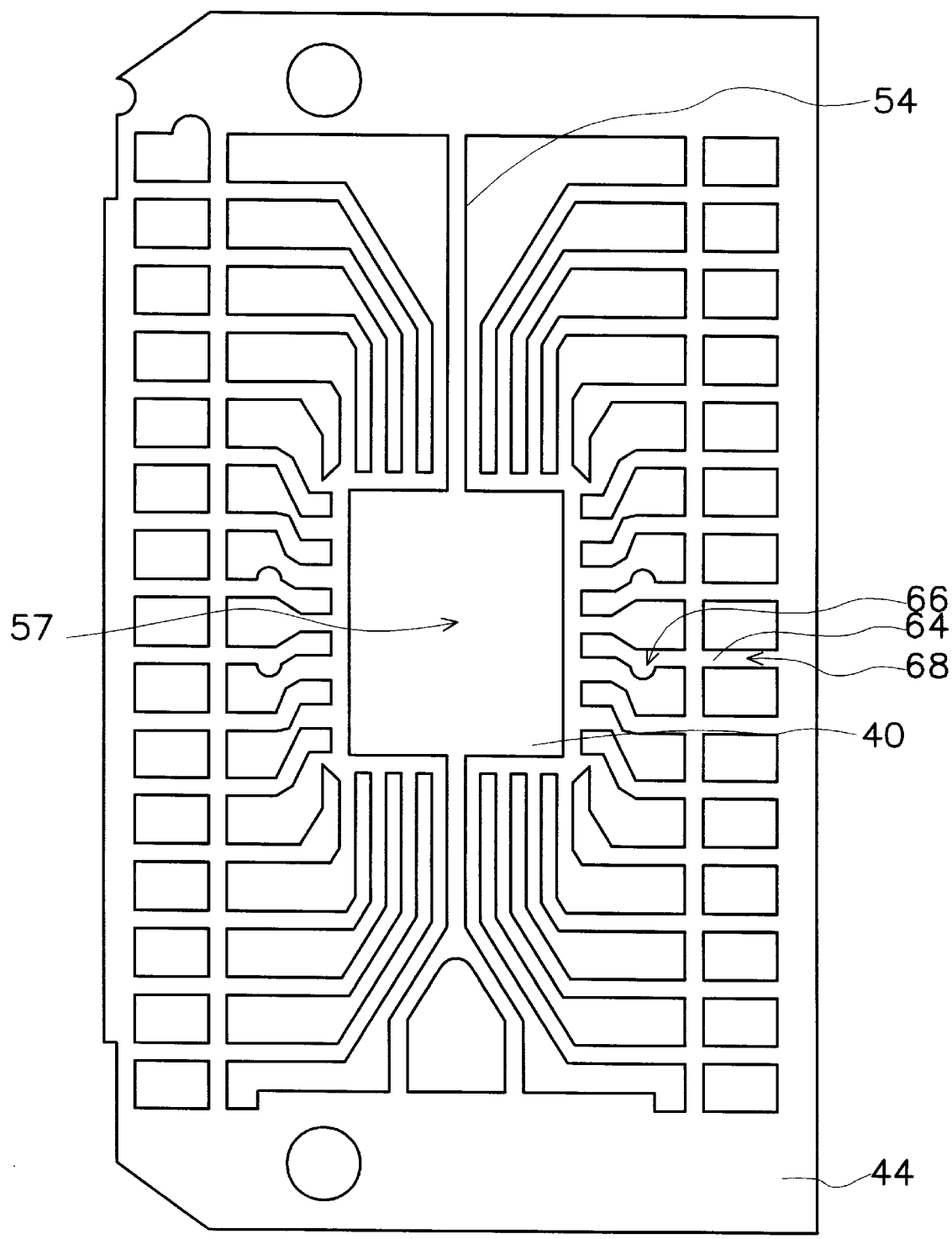
FIG. 2 is a schematic, top view showing a lead frame structure according to one preferred embodiment of this invention.

FIG. 2 is a schematic, top view showing a lead frame structure according to one preferred embodiment of this invention. As shown in FIG. 2, the lead frame structure 60 has several elements including a pair of railing 44, a pair of tie bars 54, a die pad 40 and a plurality of leads 64. The railing 44 is a contraption specifically for transferring in-process lead frames within a machine and in-between machines during chip attachment, wire-bonding or chip packaging. The railing 44 has different kinds of positioning devices such as positioning holes at fixed intervals so that the particular lead frame under operation is properly aligned inside a machine. After packaging material is injected to enclose some portions of the lead frame, the leads 64 are trimmed and formed. Lastly, the tie bar 54 connecting the railing 44 with the die pad 40 and connections between the railing 44 and the leads 64 are cut so that individual packages are formed.

The die pad 40 is the place for mounting a silicon chip. The die pad 40 is connected to the railing 44 through a pair of tie bars 54. The outer lead portion 68 of the leads 64 is directly connected to the railing 44. The inner lead portion 66 of the leads 64 surrounds the die pad 40 so that the all the leads 64 are electrically connected to the silicon chip after a wire-bonding operation.

Figure 3:
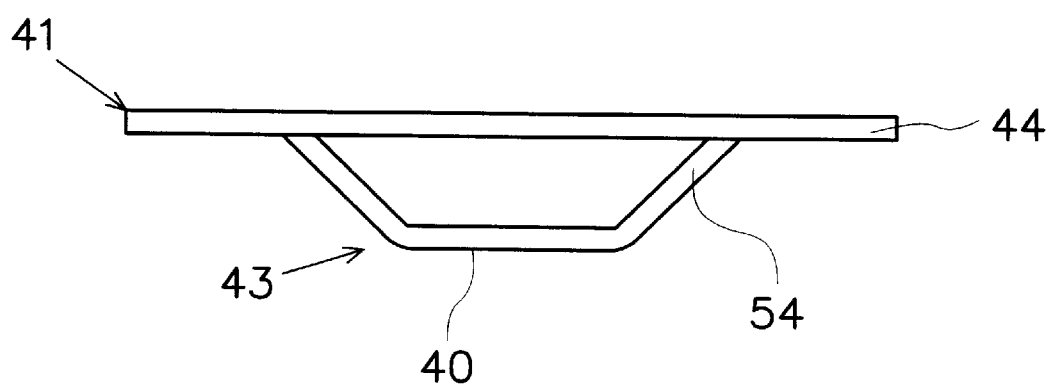
FIG. 3 is a schematic, side view showing the lead frame structure of FIG. 2.

FIG. 3 is a schematic, side view showing the lead frame structure of FIG. 2. As shown in FIG. 3, the tie bars 54 that link the die pad 40 to the railing 44 are non-aligned. The die pad 40 and the lead frame 60 are formed on different surfaces. The difference in height level between the die pad 40 and the lead frame 60 is often referred to as a down set. In this invention, the die pad lies on a first horizontal surface 43 while the leads 64 and the railing 44 lie on a second horizontal surface 41. The down set of the die pad 40 can be adjusted by varying the length or curvature of the tie bars 54 to fit a particular mold dimension.

Figure 4A:
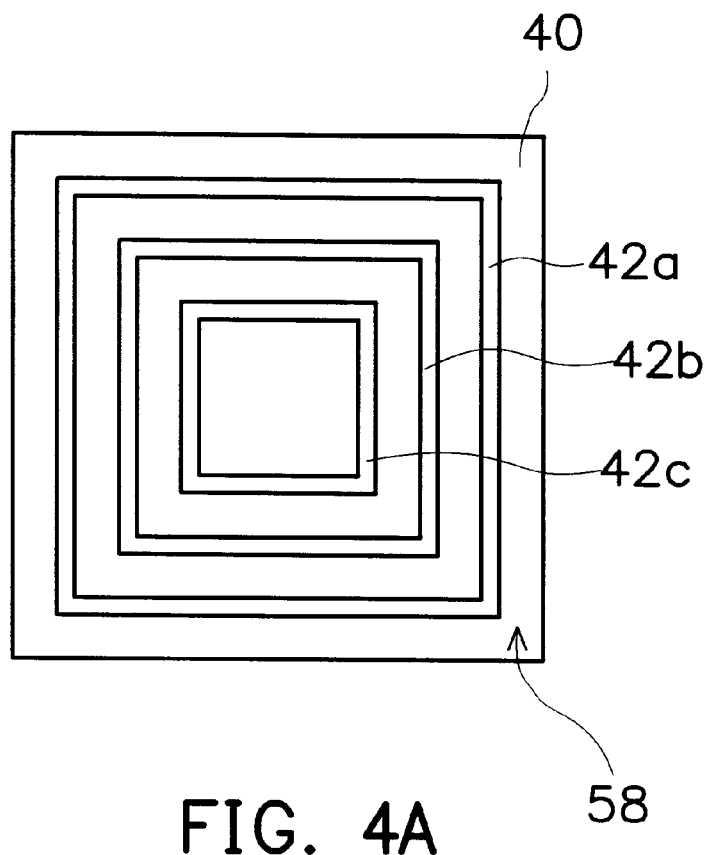
FIG. 4A is a schematic, bottom view of the die pad of the lead frame according to this invention.
Figure 4B:
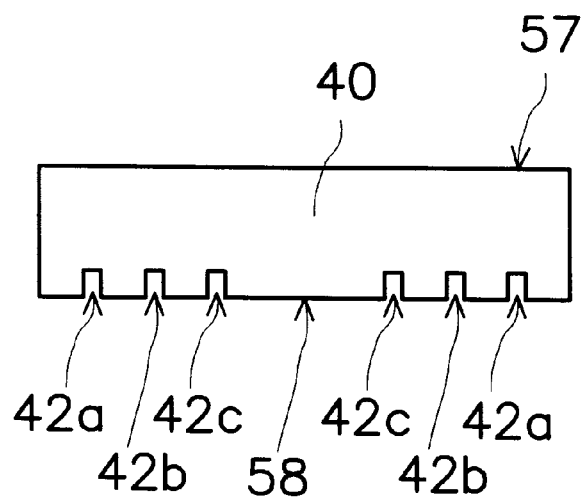
FIG. 4B is a schematic, cross-sectional view of the die pad of FIG. 4A.
Figure 5:
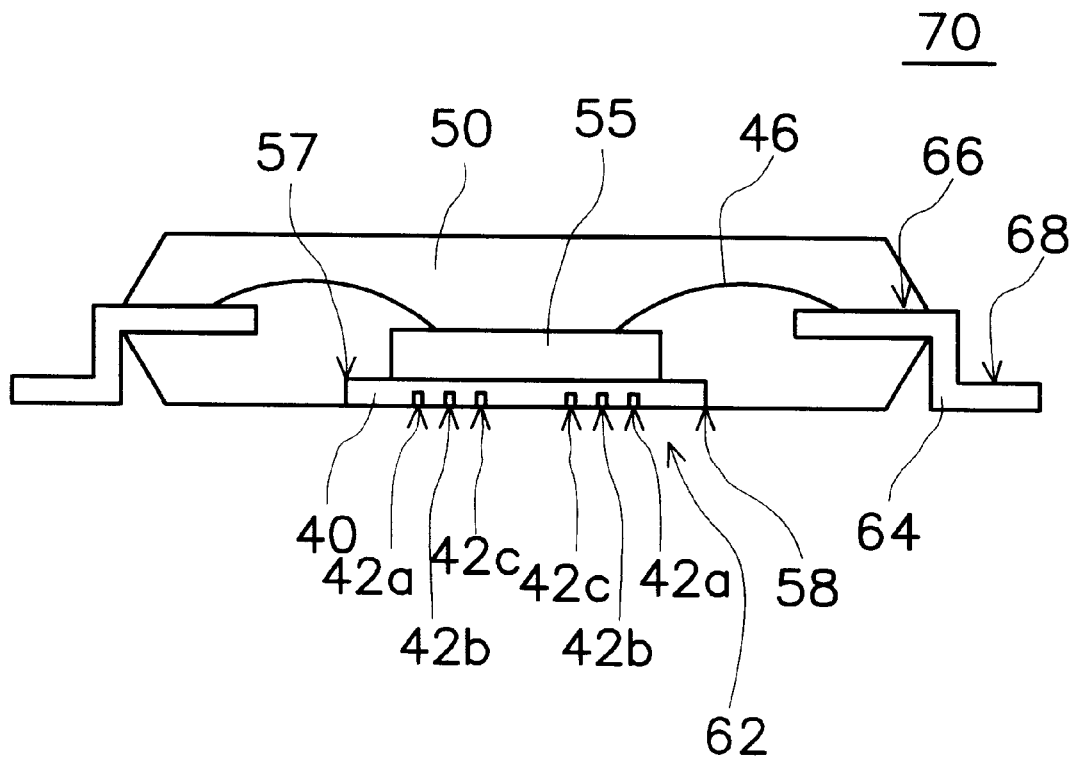
FIG. 5 is a schematic, cross-sectional view of a semiconductor package incorporating the lead frame of this invention.

FIG. 4A is a schematic, bottom view of the die pad of the lead frame according to this invention. FIG. 4B is a schematic, cross-sectional view of the die pad of FIG. 4A. FIG. 5 is a schematic, cross-sectional view of a semiconductor package incorporating the lead frame of this invention. As shown in FIGS. 4A, 4B and 5, the silicon chip 55 inside the chip package 70 is supported by the die pad 40. The leads 64 surround the chip 55. The chip 55 and the leads are electrically connected by a plurality of wires 46 so that electrical signal can easily travel between the silicon chip 55 and an external device via the wires 46 and the leads 64.

The inner lead portion 66 of the leads 64 lies on a surface opposite to a surface on which grooves are formed. Hence, when packaging compound 50 is injected to form the package, the bottom surface 58 of the die pad 40 is still exposed. The exposed surface 58 is an ideal cooling surface for rapidly removing the heat generated by the silicon chip 55.

The bottom surface 58 of the die pad 40 has a plurality of concentric rectangular grooves 42a, 42b and 42c. The annular grooves 42a, 42b, and 42c is able to prevent the spreading of mold material 50 all over the bottom surface 58 due to an imperfect zeal between a mold surface and the bottom surface 58. Due to the presence of the annular grooves 42a, 42b and 42c, any molding compound 50 that happens to leak from any contacting edges can be trapped by the first annular groove 42a. Thus, further spreading of leakage material over the remaining area of the die pad 40 is stopped, and so cooling capacity of the cooling surface can be maintained.

Note that although the annular grooves 42a, 42b and 42c on the die pad 40 is shown to be rectangular, other geometric shapes such as a circle is possible as long as all grooves have the same geometric center.

In summary, the advantages of this invention includes:
1. By forming a few concentric annular grooves and exposing the bottom surface of a die pad, heat generated by a silicon chip can be rapidly conducted away. Furthermore, the annular groove design prevents any molding compound from spreading over the entire cooling surface to affect the cooling capacity of the surface.
2. Since molding compound can hardly spread over the cooling surface in the presence of the annular grooves, polishing of cooling surface to remove residual molding compound is unnecessary. Hence, cost of production is lowered.
3. The formation of annular grooves on the cooling surface is able to provide additional cooling surface. Therefore, cooling capacity of the die pad is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lead frame for a chip package, comprising:
   a die pad having a first surface and a second surface, wherein the first surface supports a silicon chip while the second surface has a plurality of concentric grooves having a same geometric center; and
   a plurality of leads, wherein each lead can be divided into an inner lead portion and an outer lead portion such that the inner lead portion of the leads surrounds the die pad.

2. The lead frame of claim 1, wherein the concentric grooves are rectangular.

3. The lead frame of claim 1, wherein the concentric grooves include annular grooves.

4. The lead frame of claim 1, wherein the die pad is on a first planar surface while the leads are on a second planar surface.

5. A semiconductor package, comprising:
   a silicon chip;
   a die pad having a first surface and a second surface, wherein the first surface supports the silicon chip while the second surface has a plurality of grooves having a same geometric center; and
   a plurality of leads surrounding the die pad, wherein each lead can be divided into an inner lead portion and an outer lead portion;
   a plurality of conductive wires for electrical connection of the silicon chip and the leads; and
   an insulation material for enclosing the silicon chip, the inner lead portion of the leads, the conductive wires and a portion of the die pad such that the second surface of the die pad and the outer lead portion of the leads are exposed.

6. The semiconductor package of claim 5, wherein the grooves are rectangular and their geometric centers all coincide.

7. The semiconductor package of claim 5, wherein the grooves are circular and their geometric centers all coincide.

8. The semiconductor package of claim 5, wherein the insulation material includes epoxy resin.

9. The semiconductor package of claim 5, wherein the conductive wires can be made from a material chosen from a group consisting of gold, aluminum and copper.

10. A lead frame used for a chip package in which a molding material enclosing a first surface of a die pad and leaving a second surface opposite to the first surface of the die pad exposed, the lead frame comprising:
    the die pad, comprising at least a groove on the second surface to avoid the molding material spreading over the second surface; and
    a plurality of leads, surrounding the die pad and electrically connecting a chip disposed on the first surface of the die pad via a plurality of wires.

11. The lead frame of claim 8, wherein the each of the leads comprises an inner portion enclosed in the molding material, and an exposed outer portion.

* * * * *